United States Patent [19]
Wong et al.

[11] Patent Number: 5,018,169
[45] Date of Patent: May 21, 1991

[54] HIGH RESOLUTION SAMPLE CLOCK GENERATOR WITH DEGLITCHER

[75] Inventors: Hee Wong, San Jose, Calif.; Jesus Guinea, Verdellino, Italy

[73] Assignee: National Semiconductor Corporation, Santa Clara, Calif.

[21] Appl. No.: 369,474

[22] Filed: Jun. 21, 1989

[51] Int. Cl.[5] .............................................. H03D 3/24
[52] U.S. Cl. ..................................... 375/119; 331/49; 328/155
[58] Field of Search ................. 375/118, 120, 119, 81, 375/82; 331/18, 49; 329/122, 307, 346; 328/63, 155, 133

[56] References Cited

U.S. PATENT DOCUMENTS

| | | |
|---|---|---|
| 4,575,860 | 3/1986 | Scordo ............................. 375/119 X |
| 4,584,695 | 4/1986 | Wong et al. ........................... 375/81 |
| 4,780,889 | 10/1988 | Ley et al. ............................. 375/106 |

FOREIGN PATENT DOCUMENTS 0210724 8/1983 Japan .................................. 375/111

*Primary Examiner*—Benedict V. Safourek
*Assistant Examiner*—Tesfaldet Bocure
*Attorney, Agent, or Firm*—Limbach, Limbach & Sutton, Lee Patch

[57] ABSTRACT

A digital controlled clock provides ultra fine resolution for a sampling clock signal for recovering data from a received signal, the phase jump of the sampling clock signal being determined the number of stages in a multi-phase clock generator that generates a number of equally-spaced phase clock outputs based on a reference clock signal. Phase selection is performed through a very low overhead phase commutator in response to phase advance/retard inputs. A clock deglitcher matched to the stages of the ring oscillator eliminates spikes generated when the phase commutator switches.

15 Claims, 5 Drawing Sheets

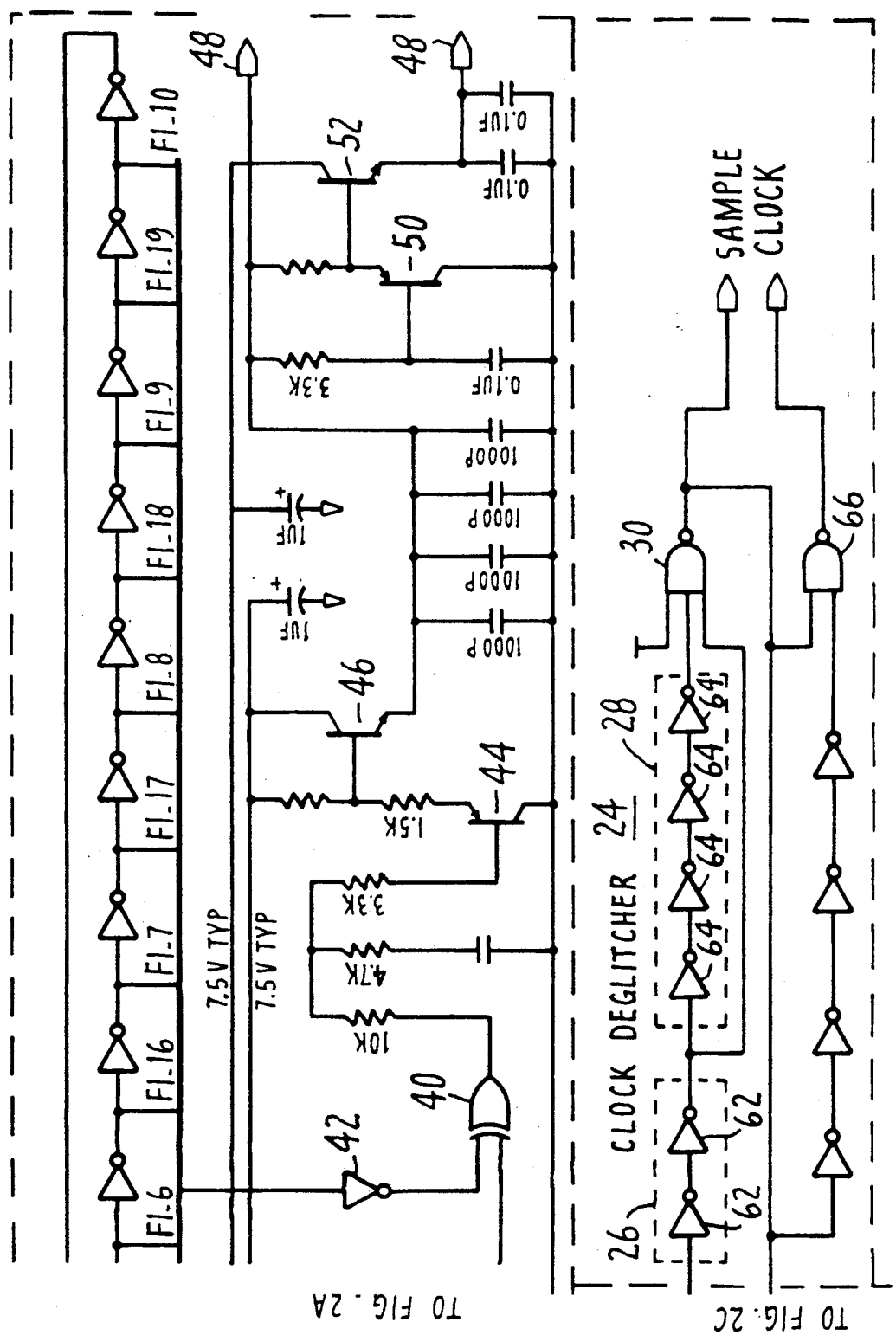

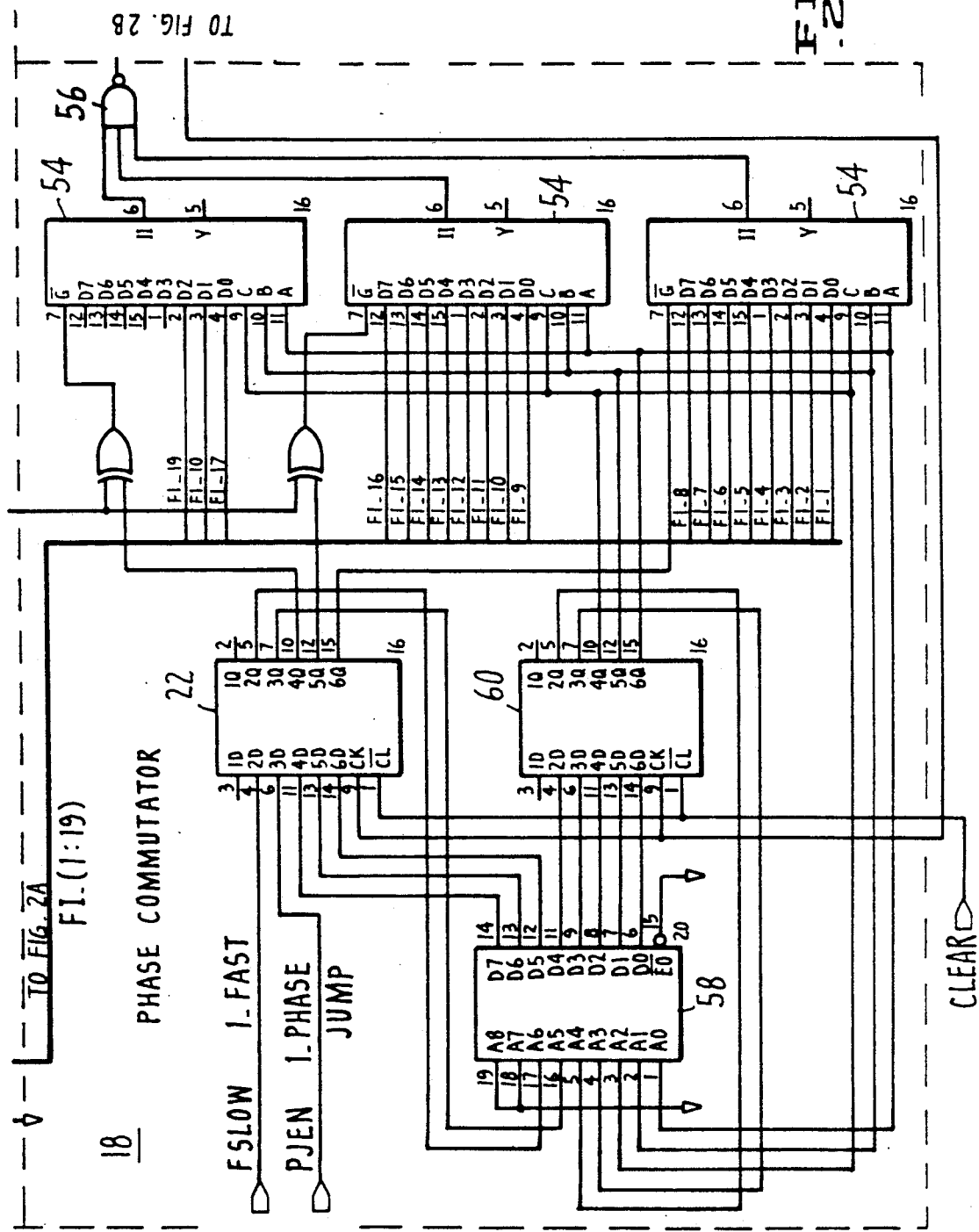

HIGH RESOLUTION SAMPLE CLOCK GENERATOR WITH DEGLITCHER

COPYRIGHT NOTICE

A portion of the disclosure of this patent document contains unpublished material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates to telecommunications systems and, in particular, to a digital controlled clock that utilizes a multi-phase ring oscillator to provide extremely fine resolution on the clock stepping utilized for recovering data from a received signal.

2. Discussion of the Prior Art

To reliably recover data from a received signal in some transmission systems, such as in Integrated Services Digital Network (ISDN) U-interface applications, there must be very stringent jitter control on the clock utilized for sampling the received signal. "Jitter" is a term used to describe short term variations of a digital signal from its ideal position in time.

It has been common in the past to use an analog phase locked loop for recovering sampling clocks from a received signal. However, analog phase locked loops are not easily integratable due to their large RC requirements for obtaining the necessary loop time constant. Therefore, extreme care must be taken in the fabrication of these integrated circuits to ensure consistent performance.

Digital phase locked loops that utilize a single phase clock do not provide fine enough resolution, resulting in unacceptably high jitter in the recovered sampling clock in some applications.

Digital phase locked loops that utilize multiphase clocks are also typically difficult to integrate due to the high speed and complexity of the conventional phase commutator circuitry required to switch among the multiple phases. Furthermore, proportional control is crude in these loops because only a single bit is controlling the phase advance/retard mechanism.

U S. Pat. No. 4,584,695, issued Apr. 22, 1986 to Wong et al, discloses a digital phase locked loop decoder that generates a sampling clock having both an effective sampling interval and clock stepping resolution that is shorter than the driver clock period. The Wong et al sampling clock generator relies on a three-stage oscillator that provides three clock signals having an equally-spaced phase relationship. A phase commutator responds to an advance/retard input to select one of the three phase clocks as the driver clock for the received signal sampler.

More specifically, each of the three stages of the Wong et al clock generator consists of an invertor and a series-connected amplifier. Thus, the period of each of the three phase outputs of the oscillator is six stage delays. Given this configuration, any phase output of the oscillator is paralleled by a phase step one-third of a period later in a second phase and a phase step one-third of a period earlier in the remaining phase. Each of the three phase output pulse trains is buffered by an amplifier and then reshaped by a set-reset flip-flop. The outputs of the three flip-flops are provided to commutator circuitry which makes corrections to the drive clock by selecting a leading or lagging phase to replace the current phase used as the driver clock signal. The commutator phase selection is implemented by providing each of the three oscillator phase outputs to a corresponding D-type flip-flop. A phase decoder provides an advance/retard signal to multiplexing circuitry indicating whether the driver clock signal is leading or lagging the data clock signal of incoming Manchester encoded data. The multiplexing circuitry drives the D flip-flops, the outputs of which are then processed by NOR gate logic to provide either an advanced or a retarded driver clock signal.

Although the sampling clock generator disclosed in the above-identified Wong et al patent represents a significant improvement over the prior art and is useful in a wide variety of applications, because of the limited number of stages utilized in the multiphase clock generator, it does not provide the degree of resolution required for data recovery in ISDN applications. Furthermore, the synchronous commutator technique utilized by Wong et al, if expanded to provide more clock phase stages and, thus, finer resolution, would require an inordinate and costly number of components to implement the required flip-flop/multiplexor scheme.

Therefore, it would be desirable to have available a simple, inexpensive sampling clock generator that provides high resolution phase stepping.

SUMMARY OF THE INVENTION

The present invention provides a digital controlled clock with ultra fine resolution. This is accomplished by utilizing a synchronous, multi-phase clock generator that provides a number of phase clocks having an equally-spaced phase relationship. The multiple phase clocks are generated by a multi-stage ring oscillator based on a reference crystal clock. Phase selection is performed by a very low overhead commutator circuit based on a phase advance/retard input. Clock deglitcher circuitry which is matched to the stages of the ring oscillator eliminates spikes generated when the phase commutator switches.

A better understanding of the features and advantages of a digital controlled clock in accordance with the present invention will be obtained by reference to the following detailed description of the invention and accompanying drawings which set forth an illustrative embodiment in which the principles of the invention are utilized.

BRIEF DESCRIPTION OF THE DRAWINGS

FIGS. 2A-2C combine to provide a schematic drawing illustrating a detailed circuit embodiment of a digital controlled clock in accordance with the present invention.

DETAILED DESCRIPTION OF THE INVENTION

Figure 1:
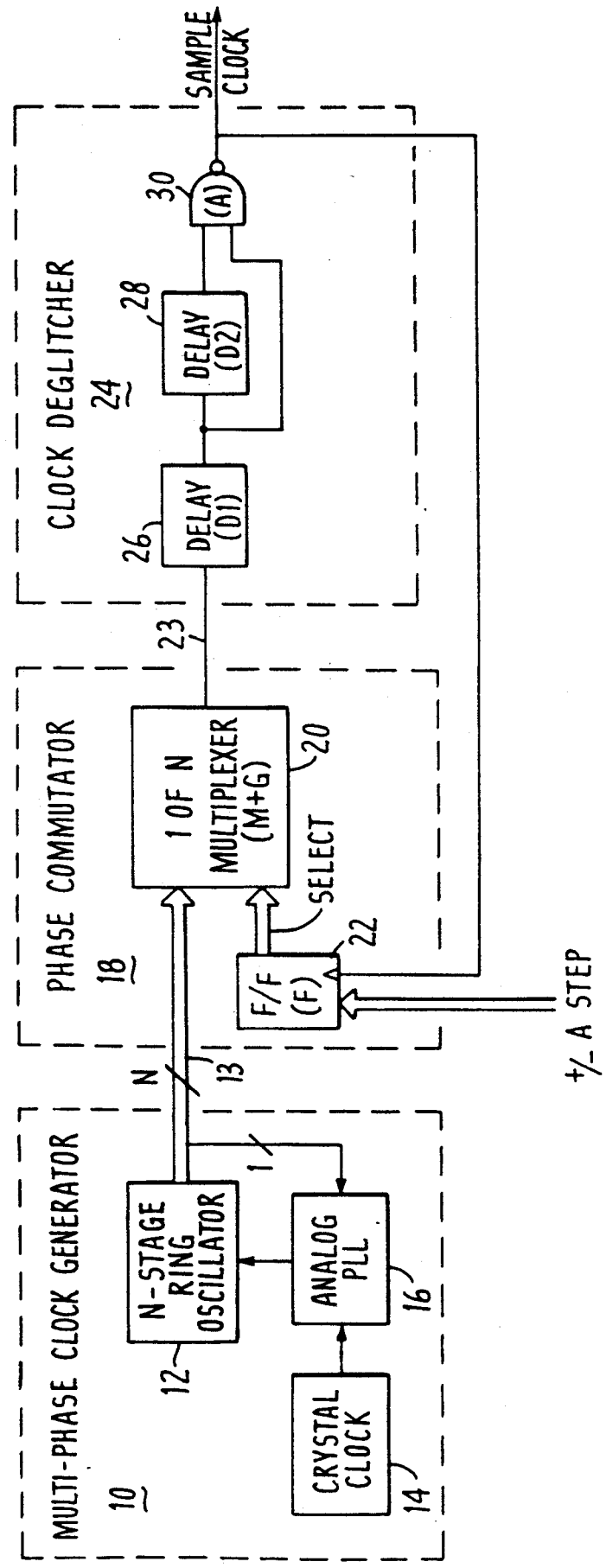
FIG. 1 is a block diagram illustrating an embodiment of a digital controlled clock in accordance with the present invention.

FIG. 1 shows a synchronous digital controlled clock that, in accordance with the concepts of the present invention, generates a sampling clock for recovering data from a received signal. It includes a multi-phase clock generator 10 that relies on an N-stage ring oscillator 12 to generate N clock signals 13 having an equally-spaced phase relationship. The frequency of each of the N phase clock signals 13 is locked to the frequency of a reference crystal clock 14 by an analog phase locked loop 16 which receives one of the phase clock signals 13 as a feedback signal 15 from the ring oscillator 12.

The N phase clock signals 13 are provided to a phase commutator 18. More specifically, the N clock signals 13 are provided to a 1-of-N multiplexor 20 which selects one of the N signals 13 in response to a SELECT signal provided by flip-flop 22. The SELECT output of flip-flop 22 causes the multiplexor 20 to advance or retard the phase clock signal currently selected by multiplexor 20 based on an +/− STEP input to flip-flop 22. As described in greater detail below, the +/− STEP input to flip-flop 22 both enables a jump between adjacent phase clock signals 13 and indicates the direction, i.e. advance or retard, of the phase jump.

Flip-flop 22 is clocked by a deglitched sample clock signal, as explained in greater detail below.

As further shown in FIG. 1, in accordance with the present invention, a clock deglitcher 24 eliminates spikes in the phase clock signal selected by multiplexor 20, i.e. multiplexor output signal 23 in FIG. 1. These spikes may be generated when the phase commutator 18 switches between phase clock signals 13.

In the illustrated embodiment, clock deglitcher 24 comprises first and second delay stages 26 and 28, respectively, the outputs of which are provided to NAND gate 30. The output of NAND gate 30 clocks flip-flop 22 to implement phase switching by phase commutator 18. The output of the second stage delay 28 constitutes the deglitched sample clock signal that is utilized to recover data from a received signal.

Figure 2A:
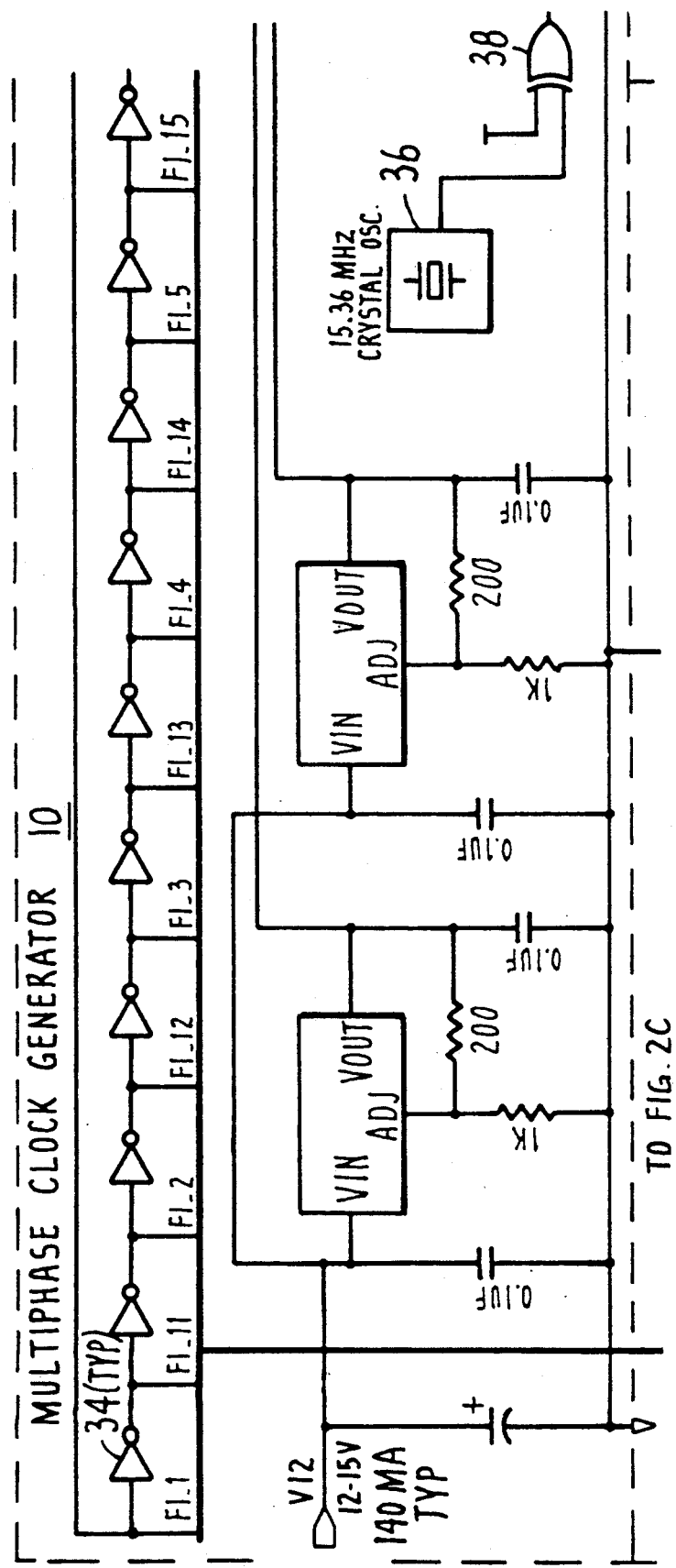

FIGS. 2A-2C combine to show a detailed circuit embodiment of a digital controlled clock in accordance with the present invention.

In the embodiment of the invention shown in FIGS. 2A-2C multiphase clock generator 10 utilizes a 19-stage ring oscillator 32. Ring oscillator 32 includes 19 series-connected invertor stages 34 which may be type 74AS04. A conventional analog phase locked loop 50 locks the 19 equally-spaced phase outputs F1.(1:19) of the ring oscillator 32 to the 15.36 MHz frequency of a crystal oscillator reference clock 36 utilizing one of the phase clock outputs, F1.6 in the illustrated example.

Figure 3:
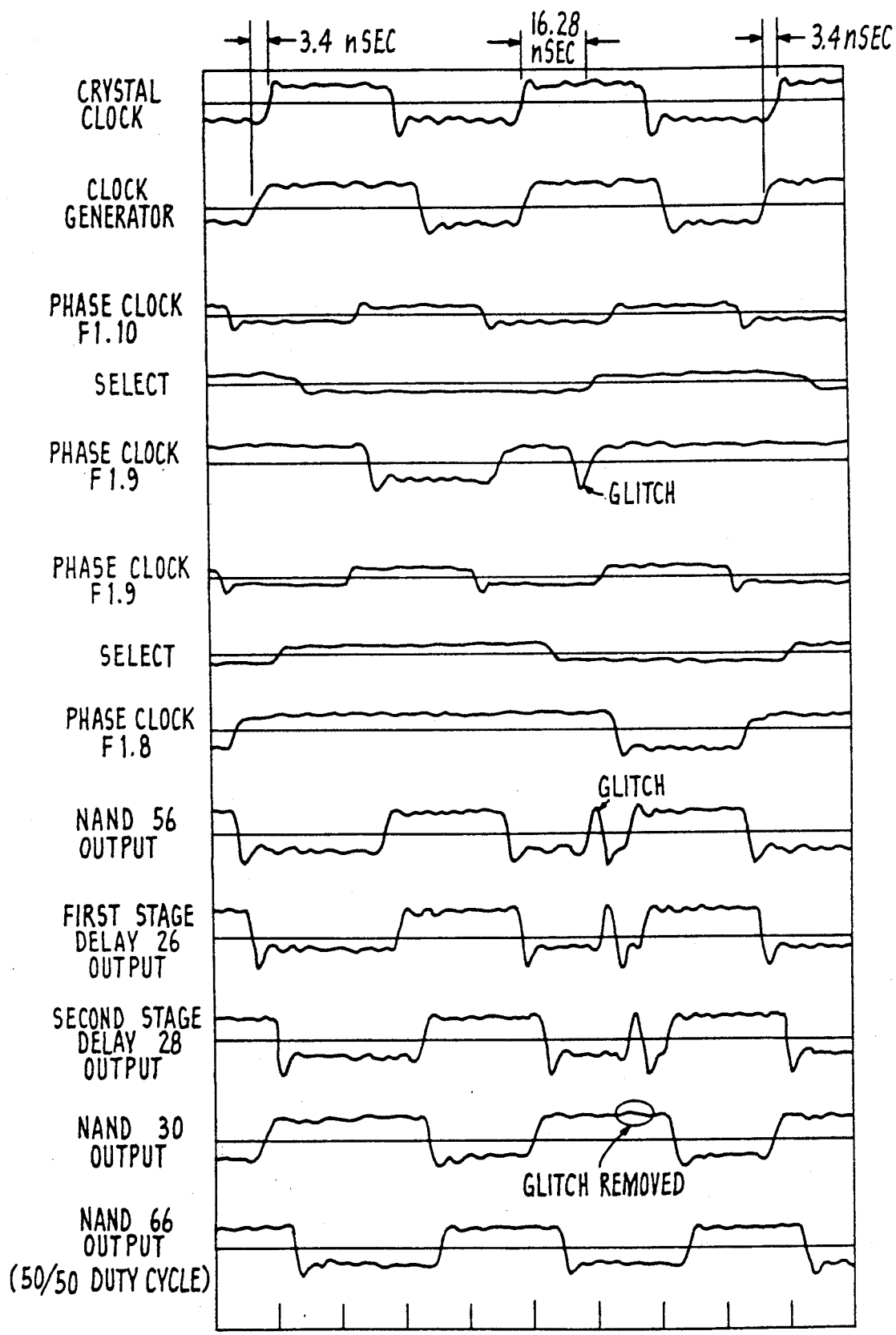
FIG. 3 is a timing diagram illustrating operation of a breadboard implementation of the FIG. 2 circuit to remove a glitch resulting from a phase retardation switch.

Because of the signal inversions caused by each adjacent invertor stage 34, physically adjacent inverter outputs do not represent adjacent phases of the 19 clock outputs of ring oscillator 32. Rather, the 19 phase clock output signals of ring oscillator 32, identified in FIG. 2A-2B as signals F1.1 through F1.19, are interleaved to achieve the proper phase switching sequence. That is, as shown in FIG. 2A, the input to the first invertor stage 34 at the "left-hand" side of FIG. 2A is the phase output F1.1, the input to the second left-hand invertor stage 34 is the phase output F1.11, the input to the third left-hand invertor stage 34 is the phase output F1.2, which, as shown in FIG. 3, is one phase jump removed from phase output F1.1, etc. Thus, for the 19-stage ring oscillator 32, the phase jump of the 15.36 MHz phase locked sampling clock is 1/19 of a period, or 3.43 nsec. Of course, the phase jump can be reduced still further by simply utilizing more stages in the ring oscillator 32.

Referring to FIG. 2A-2B the analog phase locked loop that locks the frequency of the ring oscillator 32 to the reference clock 36 includes a phase detector, comprising XOR gates 38 and 40, which receives both the output of the reference crystal 36 and any one of the phase clock outputs of the ring oscillator 32, e.g. output F1.6 as shown in FIG. 2B, via invertor 42. The output of the phase detector, which is representative of the phase difference between the reference clock 36 and the ring oscillator 32, provides a control voltage signal to transistors 44 and 46 resulting in a buffered control voltage at node 48. Node 48 is then connected to the supply pin of each of the 19 invertors 34 of ring oscillator 32 to provide a voltage controlled oscillator function.

Transistors 50 and 52 in the FIG. 2A-2C circuit provide a buffer for isolating an alternate control voltage at node 48' from the control voltage provided to the ring oscillator 32 via node 48. Node 48' provides the supply voltage for the invertor elements of deglitcher circuit 24, which is described in greater detail below.

As further shown in FIG. 2C, the 3.43 nsec.-spaced phase clock signals F1.(1:19) generated by ring oscillator 32 are provided to a phase commutator 18. More specifically, each of the phase clock signals F1.(1:19) is provided to a multiplexing arrangement comprising parallel-configured multiplexor devices 54 and NAND gate 56.

As described above with respect to FIG. 1, phase commutator 18 also includes an input latch 22, e.g. a type AS174 D flip-flop, which stores the previous input to a state machine 58 and responds to a two-bit phase advance/retard input code to provide an updated input to state machine 58. One bit, i.e. input PJEN, of the input code to latch 22 enables phase commutator 18 to make 3.43 nsec jumps between the phase clock signals F1.(1:19). The second bit, i.e. input FSLOW, of the input code to latch 22 determines the direction of the phase jump, that is, whether the 3.43 nsec. jump will be a phase advance or a phase retard.

As stated above, the output of latch 22 provides inputs to the phase commutator state machine 58, e.g. a type 74S472 ROM, which in turn provides control signals to three parallel-configured multiplexors 54, e.g. type S151, via latch 60, e.g. type AS174. The algorithm "PLLCSL.SRC" of state machine 58, which is used for selecting the appropriate phase, is provided as Appendix A at the end of this detailed description of the invention.

Thus, the three outputs 4Q-6Q of latch 60, combined with the outputs 4Q-6Q of latch 22, cause the multiplexor devices 54, in conjunction with NAND gate 56, to select one of the 19 phases clock signals F1.(1:19) from ring oscillator 32 and to provide that selected phase clock signal via the clock deglitcher circuitry 24 and the four series-connected inverters comprising 50/50 pulse processor as output SAMPLE CLOCK, the recovered sampling clock utilized in receiver circuitry for recovering data from a received signal.

Referring to FIG. 3, switching by the three multiplexor devices 54 between adjacent phases clock outputs of the 19 phases of the ring oscillator 32 clock outputs may create spikes in the selected phase output signal because of the varying delay characteristics of the associated combinatorial logic. That is, as stated above, each of the phase clocks Fl.(1:19), each of which has the period of the crystal oscillator 36 (15.36 MHz as illustrated), is shifted in phase from the adjacent phase clocks by either + or − 3.43 nsec. Switching by phase commutator 18 between two adjacent phases clocks, for example retarding the phase commutator output by switching from phase clock F1.9 to phase clock FIG. 8 as illustrated in FIG. 3, must be timed to ensure that switching does not occur during a transition of the phase clocks. Deglitcher circuitry 24 is provided to ensure that any glitches that do occur in the transition are removed.

More specifically, referring to both FIG. 2B and FIG. 3, the selected phase clock signal, i.e. the output of NAND gate 56, passes through the first delay stage 26. Delay stage 26 comprises a pair of series-connected inverters 62. The output of the first delay stage 26 serves both as the input to the second delay stage 28 and to NAND gate 30. Second delay stage 28 comprises two pair of series-connected inverters 64. In an integrated circuit version of the circuit, each of the inverters 62,64 of the first and second delay stages 26,28, respectively, is "matched" (i.e. has an identical integrated circuit layout) to the inverters of ring oscillator 32 according to conventional processing techniques. Because these inverter elements are matched, the delay through each inverter element 62,64 of deglitcher 24 is the same as the delay through each inverter element 34 of ring oscillator 32. As shown in FIG. 3, the output of the first delay stage 26 is delayed by 3.43 nsec. from its input. Passage of the first delay stage output through the second delay stage 28 introduces an additional delay of 6.86 nsec (2 × 3.43 nsec.) into the output of the second stage delay 28. Therefore, by providing both the output of the first delay stage 26 and the output of the second delay stage 28 to NAND gate 30, glitches occurring at the output of the phase commutator are removed from the SAMPLE CLOCK signal.

Additionally, the output of NAND gate 30 is passed through a third series of four inverters 66. The output of this third inverter series and of NAND gate 30 serve as inputs to NAND gate 66, resulting in the provision of a phase locked 15.36 MHz, 50/50 duty cycle SAMPLE CLOCK signal.

The modeling of the delay parameters and design equations of the above-described phase commutator/clock deglitcher loop can be discussed with reference to the general block diagram provided in FIG. 1 and the specific circuit embodiment provided in FIG. 2A-2C.

The general design parameters of the loop are provided in Table 1 below. The parameter Notations are provided parenthetically in the corresponding elements in FIG. 1.

TABLE 1

| Notation | DESIGN PARAMETERS Parameter |
| --- | --- |
| N | number of phases implemented in ring oscillator 32; |
| H15 (nSec) | duration of half the period of ring oscillator 32; |
| F (nSec) | flip/flop 22 delay; |
| M (nSec) | multiplexer 54 delay; |
| G (nSec) | multiplexer 54 glitching period, i.e., M + G denotes total propagation delay of the multiplexer. M refers to the absolute delay from the Select inputs to the output, while G is the differential delay of the switching paths; |

TABLE 1-continued

| Notation | DESIGN PARAMETERS Parameter |
| --- | --- |
| D1 (nSec) | propagation delay of first stage delay 26; |
| D2 (nSec) | propagation delay of second stage delay 28; |
| A (nSec) | propagation delay of the deglitcher NAND gate 30; |
| X(min) | minimum reading of parameter X; and |
| X(max) | maximum reading of parameter X. |

To place the phase commutator 18 and the clock deglitcher 24 in the operational mode, the three following relationships must be satisfied:

$$D2 \geq G (max) \qquad (eq. 1)$$

$$D1 + A(min) + F(min) + M(min) \geq H15*2/P \qquad (eq. 2)$$

$$D1 + D2 + A(max) + F(max) + M(max) + G(max) \leq H15(1 - 2/P) \qquad (eq. 3)$$

The design information for implementation of the above-described circuit utilizing a conventional 1 micron process is provided in Table 2 below (It is noted that the implementation of the invention is not process dependant and that the FIG. 2 embodiment can be implemented utilizing conventional process techniques.).

TABLE 2

| Parameter | DESIGN VALUES Value |
| --- | --- |
| P | 19 (19 phases) |
| H15 | 32.55 nSec (15.36 MHz) |
| F(min-max) | 1-3 nSec (estimated delay with 1 micron process) |
| M(min-max) | 1-3 nSec (estimated delay with 1 micron process) |
| G(max) | 2 nSec (estimated delay with 1 micron process) |
| D1 | 3.43 nSec (delay locked to crystal) |
| D2 | 6.86 nSec (delay locked to crystal) |
| A(min-max) | 0.5-1.5 nSec (estimated delay with 1 micron process) |

Substituting the values from Table 2 above into equations (1) through (3) above yields the following relationships:

$$6.86 \geq 2 \qquad eq. 1$$

$$3.43 + 0.5 + 1 + 1 \geq 3.43 \qquad eq. 2$$
$$5.93 \geq 3.43$$
$$3.43 + 6.86 + 1.5 + 3 + 3 + 2 \leq 29.13 \qquad eq. 3$$
$$19.79 \leq 29.13$$

From the above, it is clear that the FIG. 2 embodiment of the invention provides ample timing margin to implement a 19-phase loop.

The FIG. 3 timing diagram illustrates the practicality of breadboarding the FIG. 2A-2C circuit utilizing 74AS and 74S integrated circuits. It is noted that the algorithm "PLLCSL.SRC" of state machine 50, which is provided as Appendix A, was modified to obtain the FIG. 3 timing diagram. The modified source listing is provided as Appendix B at the end of this detailed description of the invention. Also, a 270pF capacitor was added between pin 12 of latch 22 and ground for enlarging the size of the glitch.

It should be understood that various alternatives to the embodiment of the invention described herein may be utilized in practicing the invention. It is intended that the following claims define the scope of the invention and that devices within the scope of these claims and their equivalents be covered thereby.

APPENDIX A

28 Jul 1987        09:28:33    "© National Semiconductor Corp. 19__"

```
10   ! PLLCSL.SRC      MAR 87     REVISION 0    MAR 18,87
20   ! UIF PLL CLOCK SELECTOR
30   MASS STORAGE IS "UIF:CS80,7"
40   OPTION BASE 0
50   DOUBLE Op(16383),Addbit,Datbit,Add,Dirctl,Cntin,Cntout
60   DOUBLE Stb0,Stb1,Stb2,Fast,Slow,Hold
70   File$="PLLCSL.DATA"
80   Addbit=7
90   Datbit=8
100  REDIM Op(2^Addbit-1)
110  Fast=3
120  Slow=1
130  Hold=0
140  PRINT PAGE
150  FOR Add=0 TO 2^Addbit-1
160     Def_ip(Add,"11-----",Dirctl)    ! 3=fast, 1=slow, 0,2=hold
170     Def_ip(Add,"--11111",Cntin)
180     IF Dirctl=2 THEN Dirctl=Hold
190     !
200     SELECT Dirctl
210     CASE Hold
220        Cntout=Cntin
230     CASE Fast
240        Cntout=Cntin-1
250        IF Cntout<0 THEN Cntout=18
260     CASE Slow
270        Cntout=Cntin+1
280        IF Cntout>18 THEN Cntout=0
290     END SELECT
300     !
310     Stb0=Stb1=Stb2=1
320     SELECT Cntout
330     CASE 0 TO 7
340        Stb0=0
350     CASE 8 TO 15
360        Stb1=0
370     CASE ELSE
380        Stb2=0
390     END SELECT
400     Stb1=BINEOR(1,Stb1)
410     Stb2=BINEOR(.,Stb2)
420     !
430     Op(Add)=0
440     Def_op(Op(Add),"1-------",Stb2)
450     Def_op(Op(Add),"-1------",Stb1)
460     Def_op(Op(Add),"--1-----",Stb0)
470     Def_op(Op(Add),"---11111",Cntout)
480     Print_bin(Add,Addbit,""," ",";")
490     Print_bin(Op(Add),Datbit,""," ",".")
500  NEXT Add
```

```
510 Write_data_file(File$,Op(*),Addbit,Datbit)
520 END
530 !
>>>>>> SUB Write_data_file(File$,DOUBLE Outdata(*),Abit,Dbit)
>>>>>> SUB Read_data_file(File$,DOUBLE Inf(*),Indata(*))
>>>>>> SUB Def_ip(DOUBLE Addr,M$,DOUBLE X)
>>>>>> SUB Def_op(DOUBLE Output,M$,DOUBLE X)
>>>>>> SUB Print_hex(DOUBLE X,Length,X$,Y$,Z$)
>>>>>> SUB Print_bin(DOUBLE X,Length,X$,Y$,Z$)
>>>>>> SUB Convert_hex(DOUBLE X,Length,Hex$)
>>>>>> SUB Convert_bin(DOUBLE X,Length,Bin$)
>>>>>> SUB Dbl_string(DOUBLE X,X$)
```

```
[BUG MAP]      Jul 28 1  7  [2070]           UIF/ _CSL.DATA (128x8)
RFTCP v2.1 2-85 WHee            [000.01.13] [000.06.47.C lsls....cc]
Address bit (A): '0'=Address bar     '1'=Address     '-'=no connection
Data    bit (D): '-'=no connection   '1'=wired OR    'o'=AND-NOR Pt#    (A)654 3210   (D)7654 3210
                                   o
   ----------------------------------------
   <1>      0-0 --10      ---- --1-
   <2>      0-0 1--0      -11- 1---
   <3>      0-- -0-0      ---- -1--
   <4>      010 0111      -11- 11--
   <5>      010 --01      ---- --1-
   <6>      010 ---0      ---- ---1
   <7>      010 1111      1-11 -1--
   <8>      01- 0001      ---- --1-
   <9>      011 0000      1-11 ---1
   <10>     011 ----      ---- -1--

<11>     -00 1---      -1-- ----
   <12>     -0- -0--      ---- -1--
   <13>     -0- ---1      ---- ---1
   <14>     -0- --1-      ---- --1-
   <15>     -0- 1---      --1- 1---
   <16>     -01 ----      1-11 ----
   <17>     --0 110-      -11- 1---
   <18>     --- -001      ---- -1--
   <19>     --1 0001      1-11 ----
   <20>     -10 10-1      -11- 1---

<21>     1-0 1-1-      -1-- ----
   <22>     1-- -01-      ---- -1--
   <23>     1-- --11      ---- --1-
   <24>     1-- 1--1      --1- 1---
   <25>     1-- 1-1-      --1- 1---
   <26>     1-- 11--      --1- 1---
   <27>     1-1 010-      1-11 ----
   <28>     1-1 --1-      1-11 ----
   <29>     1-1 1---      1-11 ----
   <30>     110 0000      1-11 -11-

<31>     11- --10      ---- ---1
   <32>     11- -100      ---- -111
   <33>     11- 1-00      ---- --11
   <34>     111 0000      -11- 1-11

Size of matrix = 34x(7x2+8) = 748
```

APPENDIX B

28 Jul 1987          11:55:05     "© National Semiconductor Corp. 19__"

```
 10  ! PLLCSL_TST.SRC    MAR 87    REVISION 0    MAR 18,87
 20  ! UIF PLL CLOCK SELECTOR
 30  MASS STORAGE IS "UIF:CS80,7"
 40  OPTION BASE 0
 50  DOUBLE Op(16383),Addbit,Datbit,Add,Dirctl,Cntin,Cntout
 60  DOUBLE Stb0,Stb1,Stb2,Fast,Slow,Hold
 70  File$="PLLCSL_TST.DATA"
 80  Addbit=7
 90  Datbit=8
100  REDIM Op(2^Addbit-1)
110  Fast=3
120  Slow=1
130  Hold=0
140  PRINT PAGE
150  FOR Add=0 TO 2^Addbit-1
160     Def_ip(Add,"11-----",Dirctl)    ! 3=fast, 1=slow, 0,2=hold
170     Def_ip(Add,"--11111",Cntin)
180     IF Dirctl=2 THEN Dirctl=Hold
190     !
200     SELECT Dirctl
210     CASE Hold
220        Cntout=Cntin
230     CASE Fast
240        Cntout=Cntin-1
250        IF Cntout<7 THEN Cntout=8
260     CASE Slow
270        Cntout=Cntin+1
280        IF Cntout>8 THEN Cntout=7
290     END SELECT
300     !
310     Stb0=Stb1=Stb2=1
320     SELECT Cntout
330     CASE 0 TO 7
340        Stb0=0
350     CASE 8 TO 15
360        Stb1=0
370     CASE ELSE
380        Stb2=0
390     END SELECT
400     Stb1=BINEOR(1,Stb1)
410     Stb2=BINEOR(1,Stb2)
420     !
430     Op(Add)=0
440     Def_op(Op(Add),"1-------",Stb2)
450     Def_op(Op(Add),"-1------",Stb1)
460     Def_op(Op(Add),"--1-----",Stb0)
470     Def_op(Op(Add),"---11111",Cntout)
480     Print_bin(Add,Addbit,""," ",";")
490     Print_bin(Op(Add),Datbit,""," ",".")
500  NEXT Add
510  Write_data_file(File$,Op(*),Addbit,Datbit)
520  END
530  !
>>>>>> SUB Write_data_file(File$,DOUBLE Outdata(*),Abit,Dbit)
>>>>>> SUB Read_data_file(File$,DOUBLE Inf(*),Indata(*))
```

```
>>>>>> SUB Def_ip(DOUBLE Addr,M$,DOUBLE X)
>>>>>> SUB Def_op(DOUBLE Output,M$,DOUBLE X)
>>>>>> SUB Print_hex(DOUBLE X,Length,X$,Y$,Z$)
>>>>>> SUB Print_bin(DOUBLE X,Length,X$,Y$,Z$)
>>>>>> SUB Convert_hex(DOUBLE X,Length,Hex$)
>>>>>> SUB Convert_bin(DOUBLE X,Length,Bin$)
>>>>>> SUB Dbl_string(DOUBLE X,X$)
```

*MODIFIED PAGES*

What is claimed is:

1. A digital controlled clock, comprising:
   (a) means for generating a plurality of phase clock signals having an equally-spaced phase relationship;
   (b) commutator means for selecting one of the plurality of phase clock signals; and
   (c) deglitcher circuitry for removing spikes from the selected phase clock signal, the deglitcher circuitry comprising
      (i) a first delay stage for delaying the selected phase clock signal by a first preselected amount to provide a first delay stage output signal;
      (ii) a second delay stage for delaying the first delay stage output signal by a second preselected amount to provide a second delay stage output signal; and
      (iii) a NAND gate which receives the first and second delay stage output signals as inputs and provides a sample clock signal as an output signal.

2. A digital controlled clock for generating a sample clocks signal for use in recovering data from a received signal, the digital controlled clock comprising:
   (a) a multi-phase clock generator comprising
      (i) a crystal oscillator that provides a reference clock signal having a preselected frequency;
      (ii) a multi-stage ring oscillator that provides a plurality of phase clock signals having the preselected frequency and an equally-spaced phase relationship; and
      (iii) locking means connected to receive the reference clock signal and one of the phase clock signals for locking the frequency of the phase clock signals to the preselected frequency;
   (b) a phase commutator for selecting one of the phase clock signals, the phase commutator comprising
      (i) a multiplexor that receives the plurality of phase clock signal as input signals and provides the selected phase clock signal as an output signal based on a select input signal to the multiplexor; and
   (c) clock deglitcher circuitry for removing spikes from the selected phase clock signal to provide the sample clock signal, the clock deglitcher circuitry comprising
      (i) a first delay stage for delaying the selected phase clock signal by a first preselected amount to provide a first delay stage output signal;
      (ii) a second delay stage for delaying the first delay stage output signal by a second preselected amount to provide a second delay stage output; and
      (iii) a NAND gate which receives the first and second delay stage output signals as input signals and provides the sample clock signal as an output signal.

3. A digital controlled clock for generating a sample clock signal for use in recovering data from a received signal, the digital controlled clock comprising:
   (a) a multi-phase clock generator comprising
      (i) a crystal oscillator that provides a reference clock signal having a preselected frequency;
      (ii) a multi-stage ring oscillator that provides a plurality of phase clock signals having the preselected frequency and an equally-spaced phase relationship; and
      (iii) an analog phase locked loop connected to receive the reference clock signal and one of the phase clock signals for locking the frequency of the phase clock signals to the preselected frequency;
   (b) a phase commutator for selecting one of the phase clock signals comprising
      (i) a multiplexor that receives the plurality of phase clock signals as inputs and provides the selected phase clock signal as an output based on a select input signal to the multiplexor; and
      (ii) means responsive to a phase advance/retard input signal for generating the select input signal; and
   (c) clock diglitcher circuitry for removing spikes from the selected phase clock signal to provide the sample clock signal wherein the clock deglitcher circuitry comprises:
      a first delay stage for delaying the selected phase clock signal by a first preselected amount to provide a first delay stage output;
      a second delay stage for delaying the first delay stage output by a second preselected amount to provide a second delay stage output; and
      a NAND gate which receives the first and second delay stage outputs as inputs and provides the sample clock as an output.

4. A digital controlled clock as in claim 3 wherein the multi-stage ring oscillator comprises a plurality of series-connected inverter elements and wherein the first delay stage comprises a pair of series-connected inverter elements and the second delay stage comprises two pair of series-connected inverter elements, each of the inverter elements of the first and second delay stages being matched to the inverter elements of the multi-stage ring oscillator.

5. A digital controlled clock as in claim 3 and further comprising:
   (a) a third delay stage for delaying the sample clock signal by the second preselected amount to provide a third delay stage output; and
   (b) a second NAND gate which receives the sample clock signal and the third delay stage output as inputs and provides a sample clock output having a preselected duty cycle.

6. A digital controlled clock as in claim 5 wherein the third delay stage comprises two pair of series-connected inverter elements that are matched to the inverter elements of the multi-stage ring oscillator such that the sample clock output has a 50/50 duty cycle.

7. A digital controlled clock for generating a sample clock signal for use in recovering data from a received signal, the digital controlled clock comprising:
   (a) multiphase-clock generator comprising
      (i) a crystal oscillator that provides a reference clock signal having a preselected frequency;
      (ii) a voltage controlled oscillator (VCO) comprising a plurality of series-connected inverters arranged in a ring configuration, the output of each inverter providing one of a plurality of phase clock signals having the preselected frequency and an equally-spaced phased relationship; and
      (iii) an analog phase locked loop connected to receive the reference clock signal and one of the phase clock signals for generating a control voltage signal for the VCO such that the frequency of the phase clock signals is locked to the preselected frequency;
   (b) phase commutator for selecting one of the phase clock signals, the phase commutator comprising
      (i) multiplexor means for selecting one of the plurality of phase clock signals in response to a select signal;
      (ii) a state machine responsive to an input signal for providing the select signal; and
      (iii) storage means for storing the previous state machine input signal and responsive to an advance/retard input code for providing an updated state machine input signal; and
   (c) deglitcher means for removing spikes from the selected phase clock signal to provide the sample clock signal, the deglitcher means comprising
      (i) a first delay stage for delaying the selected phase clock signal by a first preselected amount to provide a first delay stage output signal;
      (ii) a second delay stage for delaying the first delay stage output signal by a second preselected amount to provide a second delay stage output signal; and
      (iii) a NAND gate which receives the first and second delay stage output signals as input signals and provides the sample clock signal as an output signal.

8. A digital controlled clock for generating a sample clock signal for use in recovering data from a received signal, the digital controlled clock comprising:
   (a) a multi-phase clock generator comprising
      (i) a crystal oscillator that provides a reference clock signal having a preselected frequency;
      (ii) a voltage controlled oscillator (VCO) comprising a plurality of series-connected inverters arranged in a ring configuration, the output of each inverter providing one of a plurality of phase clock signals the preselected frequency and an equally-spaced phase relationship; and
      (iii) an analog phase locked loop connected to receive the reference clock signal and one of the phase clock signals for generating a control voltage signal for the VCO such that the frequency of the phase clock signals is locked to the preselected frequency;
   (b) a phase commutator for selecting one of the phase clock signals comprising
      (i) multiplexor means for selecting one of the plurality of phase clock signals in response to a select signal;
      (ii) a state machine responsive to an input signal for providing the select signal; and
      (iii) storage means for storing the previous sate machine input signal and responsive to an advance/retard input code for providing an updated state machine input signal; and
   (c) deglitcher means for removing spikes from the selected phase clock signal to provide the sample clock signal and wherein the deglitcher means comprises:
      a first delay stage comprising two series-connected inverters for delaying the selected phase clock signal by a first preselected amount to provide a first delay stage output;
      a second delay stage comprising four series-connected inverters for delaying the first delay stage output by a second preselected amount to provide a second delay stage output; and
      a NAND gate which receives the first and second delay stage outputs as inputs and provides the sample clock signal.

9. A digital controlled clock as in claim 8 wherein each of the inverters comprising the first and second delay stages is matched to the inverters of the VCO.

10. A digital controlled clock as in claim 9 and further comprising:
   (a) a third delay stage comprising four inverters, each of which is matched to the inverters comprising the VCO, for delaying the sample clock signal by the second preselected amount to provide a third delay stage output; and
   (b) a second NAND gate which receives the sample clock signal and the third delay stage output and provides a sample clock output having a 50/50 duty cycle.

11. A digital controlled clock as in claim 7 wherein the advance/retard input code to the storage means comprises a two-bit code wherein a first bit enables the phase commutator to make phase jumps among the plurality of clock signals and second bit determines the direction of the phase jump.

12. A method of generating a sample clock signal, the method comprising:
   (a) generating a plurality of phase clock signals having an equally-spaced phase relationship;
   (b) selecting one of the plurality of phase clock signals;
   (c) delaying the selected phase clock signal by a first preselected amount to provide a first delay stage output signal;
   (d) delaying the first delay stage output signal by a second preselected amount to provide a second delay stage output signal; and
   (e) logically NANDing the first and second delay stage output signals to generate the sample clock signal
whereby voltage spikes are removed from the sample clock signal.

13. A method of generating a sample clock signal for use in recovering data from a received signal, the method comprising:

(a) providing a reference clock signal having a preselected frequency;
(b) providing a plurality of phase clock signals having an equally-spaced phase relationship;
(c) locking the frequency of the phase clock signals to the preselected frequency;
(d) selecting one of the phase clock signals;
(e) removing spikes from the selected phase clock signal to provide the sample clock signal, wherein the step of removing spikes from the selected phase clock signal comprises:

delaying the selected phase clock signal by a first preselected amount to provide a first delay stage output signal;
delaying the first stage delay output signal by a second preselected amount to provide a second delay stage output; and
providing the first and second delay stage outputs as inputs to a NAND gate which provides the sample clock signal as an output.

14. A method as in claim 13 and further comprising:
(a) delaying the sample clock signal by the second preselected amount to provide a third delay stage output; and
(b) providing the sample clock signal and the third delay stage output as inputs to a second NAND gate which provides a sample clock output having a preselected duty cycle.

15. A method as in claim 14 wherein the sample clock output has a 50/50 duty cycle.

* * * * *

UNITED STATES PATENT AND TRADEMARK OFFICE
CERTIFICATE OF CORRECTION

PATENT NO. : 5,018,169

DATED : May 21, 1991

INVENTOR(S) : Hee Wong, Jesus Guinea

It is certified that error appears in the above-identified patent and that said Letters Patent is hereby corrected as shown below:

Col 16, line 8 delete "sate" and replace with —state—.

Signed and Sealed this

Eighteenth Day of May, 1993

Attest:

MICHAEL K. KIRK

Attesting Officer     Acting Commissioner of Patents and Trademarks